United States Patent [19]

Wada et al.

[11] 3,845,428

[45] Oct. 29, 1974

[54] PUSHBUTTON CHANNEL SELECTOR FOR VARIABLE CAPACITY DIODE TUNER

[75] Inventors: Yasuhiro Wada, Fujimi; Katsuhiko Okabe, Tokorozawa, both of Japan

[73] Assignee: Kabushiki Kaisha Koparu, Tokyo-To, Japan

[22] Filed: July 26, 1973

[21] Appl. No.: 382,876

[30] Foreign Application Priority Data

July 28, 1972 Japan ............................... 47-75033

[52] U.S. Cl. ..................... 334/7, 74/10.2, 74/10.39, 334/15

[51] Int. Cl. ............................................. H03j 5/08

[58] Field of Search .......... 74/10.2, 10.39; 325/464, 325/468; 334/7, 15, 17

[56] References Cited

UNITED STATES PATENTS

| | | | |
|---|---|---|---|
| 3,568,112 | 3/1971 | Thomas ............................. | 334/7 X |
| 3,624,582 | 11/1971 | Iwasaki .............................. | 334/7 X |
| 3,634,791 | 1/1972 | Yasuda et al. ......................... | 334/7 |

*Primary Examiner*—Paul L. Gensler
*Attorney, Agent, or Firm*—Cushman, Darby & Cushman

[57] ABSTRACT

A broadcast channel selecting means for all-channel tuners comprising plurality of first push buttons used for setting the last digit of the number of broadcast channels comprising two digits, plurality of second push buttons used for setting the first digit of said number of broadcast channels, plurality of switches respectively closed by operation of said push buttons, first and second rotary disks for deciding the rotational angle of a channel decoder, and a power supplying circuit arranged to rotate the tuning decoder at a comparatively low speed when said first push buttons are operated and at a compratively high speed when said second push buttons are operated, said broadcast channel selecting means being simple and quick in channel selecting operation, simple in construction and being manufactured at a low cost.

6 Claims, 6 Drawing Figures

PUSHBUTTON CHANNEL SELECTOR FOR VARIABLE CAPACITY DIODE TUNER

BACKGROUND OF THE INVENTION a. Field of the Invention:

The present invention is concerned with broadcast channel selecting means and, more particularly, it relates to a push-button type broadcast channel selecting means arranged so that any one channel can be selected out of broadcast channels ranging from the VHF band to the UHF band by pushing a pair of push buttons.

b. Description of the Prior Art:

For selecting the desired channel out of broadcast television channels ranging from the VHF band to the UHF band, various kinds of all-channel tuners are proposed at present by utilizing the rotary type tuner which has been widely used for VHF television receiving sets (for example, the tuner for which the tuning point can be set by changing over the resistance by the rotary switch for changing the voltage imposed to the variable capacity diode in the tuning circuit) and by arranging so that said rotary tuner can be driven by the pressing operation of push buttons. They are, however, complicated in their mechanical construction and/or circuit arrangement and, therefore, their production costs are high and moreover most of them had some weakpoints which are undesirable for favourable operation.

SUMMARY OF THE INVENTION

It is, therefore, a primary object of the present invention to provide a broadcast channel selecting means for all-channel tuners having comparatively simple mechanical construction and circuit arrangement and being easy to operate.

Another object of the present invention is to provide a broadcast channel selecting means for all-channel tuners for which the channel selecting motion is very quick and with which the desired broadcast channel can be selected accurately and reliably.

Still other objects and advantages of the channel selecting means according to the present invention will become evident by the detailed description of embodiment given below according to the accompanying drawings.

DETAILED DESCRIPTION OF THE PREFERRED EMBODIMENT

Figures 1, 2, 3, 4:
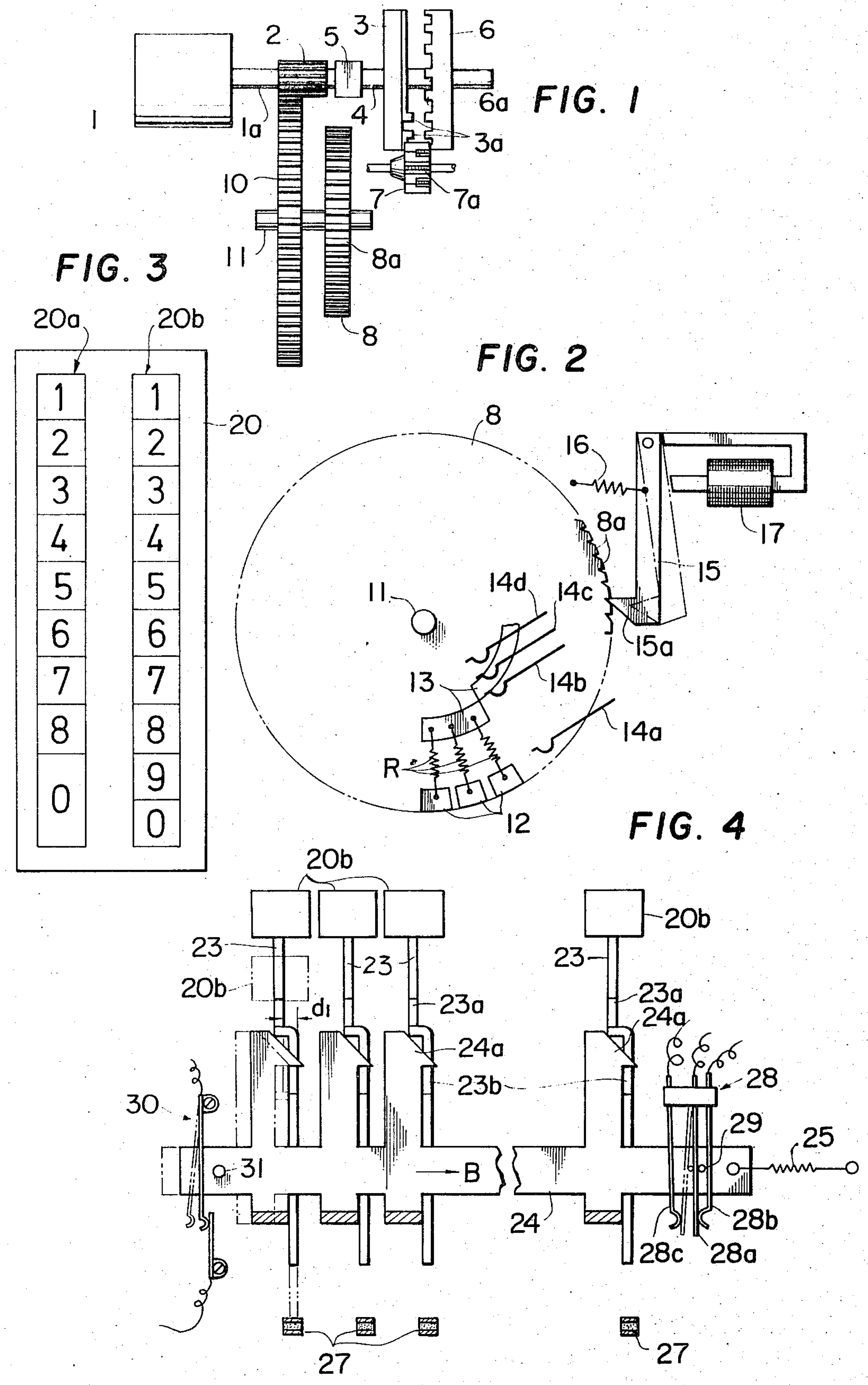
FIG. 1 shows a side view diagramatically illustrating the rotary driving mechanism portion of the broadcast channel selecting means according to the present invention.
FIG. 2 shows a front view illustrating an example of the tuning decoder and its stopping means.
FIG. 3 shows a front view illustrating an example of push button arrangement.
FIG. 4 shows a side view illustrating the structure of the push-button row for the last digit of the channel number and the related holding mechanism and switch devices.
Figure 5:
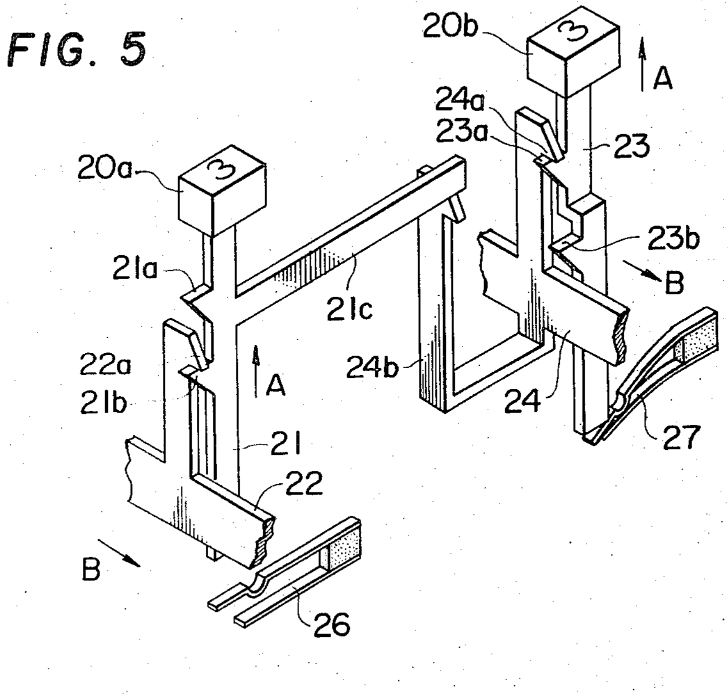
FIG. 5 shows a perspective view illustrating the linking mechanism relating the push button for the last digit with the push button for the first digit.
Figure 6:
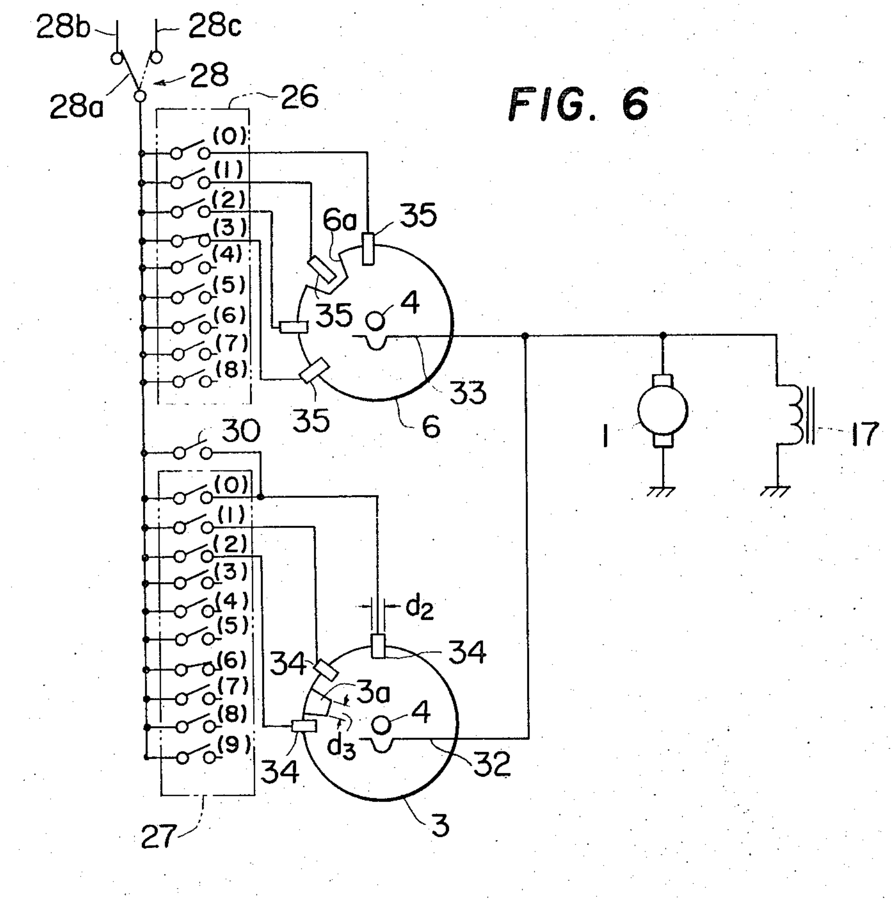
FIG. 6 shows a wiring diagram of an example of the electric circuit applicable to the channel selecting means according to the present invention.

In the drawings, numeral 1 designates a driving motor having an output shaft 1*a*, numeral 2 designates a gear fixed to the output shaft 1*a*, and numeral 3 designates a first rotary disk to be described later which is secured to a rotary shaft 4 and has a pair of teeth 3*a* at the circumference of the side face thereof. The rotary shaft 4 is connected to said output shaft 1*a* through, for example, a speed reduction gear mechanism 5 of known art. Numeral 6 designates a second rotary disk to be described later having a plural number of teeth 6*a* equally spaced along the circumference of the side face thereof. Numeral 7 designates an intermittent feed pinion of known art having teeth 7*a* engageable with said teeth 3*a* and 6*a* arranged to transmit the rotary motion of the first rotary disk 3 to the second rotary disk 6 so that, for example, the second rotary disk 6 will intermittently rotate every 1/9 to 1/7 turn when the first rotary disk 3 turns one rotation. Numeral 8 designates a channel decoder having ratchet teeth 8*a* formed and equally spaced on its peripheral surface at a predetermined interval and concentrically and integrally connected to a rotary shaft 11 together with a gear 10. Said output shaft 1*a* and rotary shaft 11 are suitably arranged so that said gears 2 and 10 will mesh with each other. Numeral 12 designates electrically conductive pieces equally spaced on said channel decoder 8 and along the circumference thereof. Though only three conductive pieces 12 are shown in FIG. 2, they are actually provided in the number corresponding to the number of all broadcast television channels. To distinguish these conductive pieces in the following description, the conductive piece correcponding for example with the twentieth channel is expressed as 12-(20). Respective conductive pieces 12 are connected, through resistors R each having resistance different from each other, to three electrically conductive segments 13 which are concentrically arranged on the channel decoder 8, each of said conductive segments 13 corresponding to the low VHF band block, high VHF band block and UHF bank block. On the accompanying drawing, only two conductive segments 13 and three resistors R are shown so that the figure will not become too complicated. However, for the conductive piece provided between the conductive piece 12-(1) corresponding to the first channel and conductive piece corresponding to the final channel, i.e., for the conductive piece 12-(0), said electrical connection is not made at all. Numeral 14*a* designates a brush arranged to slidably contact each of said conductive pieces 12 and connected to the variable capacity diode in the tuner circuit of the television receiving set. Numerals 14*b*, 14*c* and 14*d* respectively designate brushes arranged to slidably contact each of said conductive segments 13 and to impose supply voltages which are different from each other corresponding to the low VHF band, high VHF band and UHF band. Numeral 15 designates an armature lever urged by a spring 16 in the direction that a pawl portion 15*a* thereof always meshes with said ratchet tooth 8*a*. Numeral 17 designates an electro-magnet which attracts said armature lever 15 when being energized and releases the pawl portion 15*a* from meshing with the ratchet 8*a*. This electro-magnet 17 is connected in parallel with said driving motor 1 (see FIG. 6). Numeral 20 designates a channel-selecting push-button assembly provided at the front of the television receiving set which contains push buttons 20*a* from 0 through 8 for the first digit of the channel number and push button 20*b* from 0 through 9 for the last digit of the channel number. Consequently, the total number of broadcast channels selectable by this push-button assembly is 89 channels. The number of first-digit push buttons 20*a* can be changed to 0 through 6 or 0 through 7 according to the total number of broadcast channels at the location where the television receiving set in question is used. Then, the number of receivable broadcast channels of course becomes 69 channels in the former case and 79 channels in the latter case. Numeral 21 designates first operating links secured to the bottom of each of said first-digit push buttons 20*a* and being movable in pushing-in direction of said push buttons 20*a*. The first operating link 21 has holding protuberances 21*a* and 21*b* on one side and an arm 21*c* for releasing the last-digit push button on the other side and is always urged in the direction shown by the arrowhead A by a spring not illustrated here. Numeral 22 designates a first holding plate having a holding member 22*a*, which is capable of holding the first-digit push button 20*a* at the pushed-in position or released position by engaging with said holding protuberance 21*a* or 21*b*. The first holding plate 22 is arranged as being movable in the direction along the row of said first-digit push buttons 20*a* and is urged in the direction shown by the arrowhead B by means of a spring not illustrated here. Numeral 23 designates second operating links respectively secured to the bottom of last-digit push buttons 20*b* and being movable in the pushing-in direction of push button 20*b*. Said second operating link 23 has holding protuberances 23*a* and 23*b* on one side like those of said first operating link 21. The second operating link 23 is bent between protuberances 23*a* and 23*b* so that the protuberance 23*b* is shifted from the protuberance 23*a* by the distance $d_1$ relative to the pushing-in direction of the push button 20*b* (see FIG. 4) and is always urged, like the first operating link 21, by the spring not illustrated here in the direction shown by the arrowhead A. Numeral 24 designates a second holding plate having a holding member 24*a* for holding the last-digit push button 20*b* at the pushed-in or released position by engaging with said holding protuberance 23*a* or 23*b* and having a releasing member 24*b* which engages with said releasing arm 21*c* for the last-digit push button. The second holding plates 24 are arranged as being movable in the direction along the row of last-digit push buttons 20*b* and are always urged by the spring 25 (FIG.4) in the direction shown by the arrowhead B. Below each of first operating links 21 and second operating links 23, first and second normally-open type switches 26 and 27 are respectively provided so that they are closed when the respective push buttons are pushed in and said operating links 21 and 23 are moved in the direction opposite to the arrowhead A. Numeral 28 designates a change-over switch for changing over the supply voltage to the driving motor 1. The movable contact 28*a* connected to the driving motor 1 contacts the high-voltage supplying contact piece 28*b* when all of last-digit push buttons 20*b* are in the released positions (the positions shown by full lines in FIG. 4). When any of last-digit push buttons 20*b* is in the pushed-in position (the position shown by chain lines in FIG. 4), the movable contact piece 28*a* is forced, by the pin 29 fixed at one end of the second holding plate 24, to contact the low-voltage supplying contact piece 28*c*. Numeral 30 designates a switch connected in parallel with the normallyopen type switch 27 which corresponds to the "0" button in last-digit push buttons 20*b*. This switch 30 is kept closed when all of last-digit push button 20*b* are in released positions but is opened by the pin 31 fixed to the second holding plata 24 when any of last-digit push buttons 20*b* is in the pushed-in position. As shown in FIG. 6, said first rotary disk 3 and second rotary disk 6 are formed by electrically conductive material and respectively have notches or non-conductive portions 3*a* and 6*a* made of electrically insulating material at a predetermined portion. To the central portion of these rotary disks 3 and 6, brushes 32 and 33, which are respectively connected to the parallel circuit of the driving motor 1 and electro-magnet 17, are contacting slidably. Along circumferences of rotary disks 3 and 6, contactors 34 and 35 respectively connected to one end of said normally-open type switches 27 and 26 are arranged as being equally spaced and are contacting the respective rotary disks. Though FIG. 6 shows only three and four of contactors 34 and 35, respectively, ten contactors 34 and nine contactors 35 are provided actually. The other ends of said normally-open type switches 26 and 27 are all connected to the movable contact piece 28*a* of said switch 28. Therefore, power to the driving motor 1 and electro-magnet 17 is supplied through the switch 28, one of switches 26, contactor 35 connected to said switch 26, second rotary disk 6 and brush 33, or from the switch 28 through one of switches 27, contactor 34 connected to said switch 27, first rotary disk 3 and brush 32. When the rotary disks 3 and 6 are rotated and the contactor 34 or 35, which is supplying power, coincides with the non-conductive portion 3*a* or 6*a*, connection between the contactor 34 and brush 32 or between the contactor 35 and brush 33 is disconnected and, consequently, power supply to the driving motor 1 and electro-magnet 17 is stopped when said disconnecting operations of electricity at said rotary disks 3 and 6 are effected at the same time. For easier unerstanding of the relation between said various members and push buttons, the normally-open type switch 26 and its contacting piece 35, which correspond for example to the "6" button of first-digit push buttons 20*a*, are respectively expressed as 26-(6) and 35-(6) in the following description. Now, in case of the present embodiment, first-digit push buttons 20*a* can take nine positions from "0" through "8", and therefore, the number of teeth 6*a* of the second rotary disk 6 and number of teeth 7*a* of the pinion 7 are selected so that the second rotary disk 6 is rotated 1/9 turn when the first rotary disk 3 is turned one rotation. That is, it is so arranged that the rotary speed ratio of the first rotary disk 3 and second rotary disk 6 becomes 1 : 1/9. When first-digit push buttons 20*a* take seven positions form "0" to "6", it is to be arranged so that said speed ratio becomes 1 : 1/7 and, when said push buttons 20*a* take eight positions from "0" through "7", it is to be arranged so that said speed ratio becomes 1 : 1/8. On the other hand, the rotary speed ratio between the output shaft 1a and rotary shaft 4 given by said speed reduction mechanism 5 is decided as 10 : 1 regardless of the rotary speed ratio between rotary disks 3 and 6. The rotary ratio between the gear 2 and gear 10 is decided so that the tuning decoder 8 turns one rotation when said second rotary disk 6 turns one rotation, i.e., as 90 : 1.

The broadcast channel selecting means according to the present invention is arranged as described in the above. The operation of this channel selecting means is as described below. That is, when the brush 14*a* is contacting the conductive piece for the "0" channel 12-(0) and all push buttons 20*a* and 20*b* of the push-button assembly 20 are in released positions, current does not flow to the driving motor 1 nor electromagnet 17 provided that the non-conductive portion 6*a* of the second rotary disk 6 is in the position corresponding the contact piece 35-(0) connected to the normally-open switch 26-(0) and that the non-conductive portion 3*a* of the first rotary disk 3 is in the position corresponding to the contact piece 34-(0). Therefore, the tuning decoder 8 is held in the locked condition because the pawl portion 15*a* of the armature lever 15 engages with the ratchet tooth 8*a*. When it is desired to select for example the No. 36 channel in this condition, the "3" button of first-digit push buttons 20*a* is pressed at first. By this pressing, the operating link 21-(3) comes down by temporarily first holding plate 22 to the direction opposite to the arrowhead B by means of the holding protuberance 21a and, when the tip of the operating link 21-(3) closes the switch 26-(3), the holding member 22*a* of the first holding plate 22 engages with said holding protuberance 21*a* and, consequently, the "3" button is held in the pushed-in position. By said movement of the operating link 21, the releasing arm 21*c* pushes the releasing member 24*b* and moves the second holding plate 24 to the direction opposite to the arrowhead B. At that time, none of last-digit push buttons 20*b* is in the pushed-in position and, therefore, last-digit push buttons 20*b* stay in the existing positions. By said closing of the switch 26-(3), a high voltage is imposed to the driving motor 1 and electro-magnet 17 through the high-voltage contact piece 28*b* of the switch 28, movable contact piece 28*a*, "3" button switch 26-(3), contactor 35-(3), second rotary disk 6 and brush 33. As a result, the electro-magnet 17 attracts the armature lever 15 and releases the pawl portion 15*a* from the ratchet tooth 8*a* and, at the same time, the driving motor 1 begins to rotate at a comparatively high speed. When the first rotary disk 3 turns three rotations by this rotation of the driving motor 1, the second rotary disk 6 rotates ⅓ turn and the non-conductive portion 6*a* of the second rotary disk 6 comes to the position corresponding to the contactor 35-(3) connected to the switch 26-(3). Therefore, electric current to the motor 1 and electro-magnet 17 is shut off and the channel decoder 8 is stopped instantaneously by the armature lever 15. Between said starting and stopping of the driving motor 1, said channel decoder 8 is rotated ⅓ turn by gears 2 and 10 and the brush 14*a* contacts the conductive piece 12-(30) which corresponds to the channel No. 30. When the "6" button of last-digit push buttons 20*b* is then pressed, the operating link 23-(6) comes down by temporarily moving the second holding plate 24 to the direction opposite to the arrowhead B by means of the holding protuberance 23*a* and, when the tip of the second operating link 23-(6) closes the switch 27-(6), the holding member 24*a* of the second holding plate 24 engages with the holding protuberance 23*a* and, consequently, the "6" button is held in the pushed-in position. When said "6" button is held in the pushed-in position, the second holding plate 24 is held being slightly moved to the direction opposite to the arrowhead B compared with the case where said last-digit push button 20*b* is in the released position. As a result, the movable contact piece 28*a* of the switch 28 is forced to contact the low-voltage contact piece 28*c* by means of the pin 29 as shown by chain lines in FIG. 4 and FIG. 6. Therefore, at the same time when said "6" button is pressed, a low-voltage is imposed to the motor 1 and electro-magnet 17 through the low-voltage contact piece 28*a* of the switch 28, movable contact piece 28*a*, "6" button switch 27-(6), contactor 34-(6), first rotary disk 3 and brush 32, and the channel decoder 8 is rotated again but this time at a comparatively low speed. When the driving motor 1 rotates and the first rotary disk 3 is rotated 6/10 turn, the non-conductive portion 3*a* of the first rotary disk 3 comes to the position corresponding to the contactor 34-(6) and, consequently, electric current to the motor 1 and electromagnet 17 is shut off and the channel decoder 8 is again held being stopped. During this period, the channel decoder 8 is rotated 6/90 turn. Therefore, the brush 14*a* contacts the contact piece 12-(36) which corresponds to the channel No. 36 and, as a result, the television broadcasting of the channel No. 36 is received. To change over the channel which is set as above to another channel, for example, to the channel No. 78, the "7" button of first-digit push buttons 20*a* shall be pressed first and, then, the "8" button of last-digit push buttons 20*b*. That is, when the "7" button of first-digit push buttons 20*a* is pressed, the first holding plate 22 is temporarily moved to the direction opposite to the arrowhead B and, consequently, the "3" button held at the pushed-in position is released. At the same time, the second holding plate 24 is also moved temporarily to the direction opposite to the arrowhead B by means of the releasing arm 21*c* and the "6" button of last-digit push buttons 20*b* is also released from the pushed-in position and returns to the released position. By the subsequent pressing operation, said "7" button is held at the pushed-in position at the same time when the switch 26-(7) is closed, and the tuning decoder 8 and first and second rotary disks 3 and 6 are rotated. At that time, the second holding plate 24 is in the position shown by full lines in FIG. 4 and the switch 30 is closed. Therefore, power to the motor 1 and electro-magnet 17 is supplied through both of brushes 32 and 33. Consequently, even when the second rotary disk 6 is driven intermittently and its conductive portion 6*a* comes to the position corresponding to the contactor 35-(7) (at that time, on the channel decoder 8, the brush 14*a* is moved to the position to contact the conductive piece 12-(66) which corresponds to the channel No. 66), power to the motor 1 and electro-magnet 17 is still supplied through the switch 30. So, the first rotary disk 3 and channel decoder 8 further rotate and the whole mechanism is stopped only when the non-conductive portion 3*a* of the first rotary disk 3 comes to the position corresponding to the contactor 34-(0). Then, the brush 14*a* is contacting the conductive piece 12-(70) which corresponds to the channel No. 70. When the "8" button of last-digit push buttons 20*b* is then pressed, the whole mechanism is stopped when the brush 14*a* contacts the conductive piece 12-(70) which correspond to the channel No. 78. As the operation of the mechanism at that time is just the same as that described for the case where selecting the channel Np. 36, the detailed explanation is omitted here. Besides, it may be easily understood from the above explanation that any channel from the channel No. 1 through the channel No. 9 can be selected by first pressing the "0" button of first-digit push buttons 20*a* and subsequently pressing the desired button out of last-digit push buttons 20*b*.

In the embodiment described in the above, a high voltage is imposed to the driving motor 1 when setting the first digit of the channel number and a low voltage is imposed when setting the last digit by changing over the voltage. The reason of this change-over is as follows. That is, even when only a high voltage is simply imposed in order to shorten the channel selecting time, there will occur a time lag in the channel decoder stopping mechanism comprising the electro-magnet 17 and armature lever 15, and the accuracy of the stopping position may decrease. Therefore, the high voltage is imposed only when setting the first digit for which a longer time is required compared with the setting time for the last digit, in order to reduce the channel selecting time as far as possible. To achieve still higher accuracy, it is desirable that the width $d_2$ (FIG. 6) of the contactor 34-(0), which is related to "0" button of last-digit push button 20*b*, is made as small as possible and that the width $d_3$ of the non-conductive portion 3*a* of the first rotary disk 3 is made as large as possible.

We claim:

1. A broadcast channel selecting means for all-channel tuners comprising first push button each bearing a numeral from "0" at least up to "6" and arranged in one row in the order of those numerals, first operating links respectively fixed to said first push buttons, second push buttons each bearing a numeral from "0" through "9" and arranged adjacent to said first push buttons in one row in the order of those numerals, second operating links respectively fixed to said second push buttons, a first holding plate respectively engageable with said first push buttons and movable in the direction at a right angle to the moving direction of said first push buttons, a second holding plate respectively engageable with said second push buttons and movable in the direction at a right angle to the moving direction of said second push buttons, first switches arranged adjacent to said first push buttons and closed by said first push buttons, second switches respectively arranged adjacent to said second push buttons and closed by said second push buttons, first contactors respectively connected to said second switches, a first rotary disk electrically connected to said first contactors and having a first non-conductive portion thereon, second contactors respectively connected said first switches, a second rotary disk electrically connected to said second contactors and having a second non-conductive poriton thereon and intermittently rotated by said first rotary disk, a motor connected to said first rotary disk for rotating said first rotary disk, and a channel decoder connected to said motor and rotated by said motor, one terminal of said motor being electrically connected to said first and second rotary disks respectively.

2. A broadcast channel selecting means for all-channel tuners according to the claim 1, in which said broadcast channel selecting means further comprises a change-over switch connected to said first and second switches and controlled by said second holding plate for change-over, said broadcast channel selecting means being arranged to rotate said channel decoder at a comparatively high speed when said first push button is operated and to rotate said channel decoder at a comparatively low speed when said second push button is operated.

3. A broadcast channel selecting means for all-channel tuners according to the claim 1, in which said broadcast channel selecting means further comprises a third switch connected in parallel with said second switch corresponding to said second operating link secured to said second push button bearing the digit "0" and opened and closed by said second holding plate, said third switch being arranged to open when any one of said second push buttons is pressed.

4. A broadcast channel selecting means for all-channel tuners according to the claim 1, in which said broadcast channel selecting means further comprises an armature lever arranged adjacent to said channel decoder and capable of locking said channel decoder, and an electromagnet arranged adjacent to said armature lever and being capable of attracting said armature lever and connected in parallel with said motor, said broadcast channel selecting means being arranged so that said channel decoder is held by said armature lever when said channel decoder is stopped.

5. A broadcast channel selecting means for all-channel tuners according to the claim 1, in which said first and second non-conductive portions are notches formed on said first and second rotary disks.

6. A broadcast channel selecting means for all-channel tuners according to the claim 1, in which said first and second non-conductive portions are formed by electrically insulating material attached to said first and second rotary disks.

* * * * *